United States Patent [19]

Andros et al.

[11] 4,291,364
[45] Sep. 22, 1981

[54] AIR-COOLED HYBRID ELECTRONIC PACKAGE

[75] Inventors: Frank E. Andros, Binghamton; Ghazaros K. Kerjilian; Bert E. Stevens, both of Vestal; Reinhold E. Tomek, Endwell, all of N.Y.

[73] Assignee: International Business Machines Corporation, Armonk, N.Y.

[21] Appl. No.: 106,966

[22] Filed: Dec. 26, 1979

[51] Int. Cl.³ .............................................. H05K 7/20
[52] U.S. Cl. ................................. 361/384; 165/80 E
[58] Field of Search ............... 361/381, 382, 383, 384, 361/386, 412, 414, 415; 174/15 R, 16 R; 165/80 B, 80 C, 80 D, 122

[56] References Cited

U.S. PATENT DOCUMENTS 3,923,466 12/1975 Seelig .................................. 165/139

FOREIGN PATENT DOCUMENTS 2138376 10/1977 Fed. Rep. of Germany ...... 361/384
581225 8/1958 Italy .................................... 361/384

OTHER PUBLICATIONS

IBM Tech. Discl. Bull. vol. 22, No. 2, Jul. 1979, pp. 696, 697, Push-Pull Multi-Flow System-, Hwang and Simons.
Planar Heat Exchanger, Moran & Simons, IBM Tech. Discl. Bull. vol. 22, No. 2, Jul. 1979, pp. 698, 699.
IBM Tech. Discl. Bull., Thermally Enhanced Multilayer Ceramic Substrate, Kerjilian, vol. 18, No. 2, Jul. 1975, p. 353.

Primary Examiner—Gerald P. Tolin
Attorney, Agent, or Firm—Gerald R. Gugger

[57] ABSTRACT

Metallized ceramic modules (MC), which are mounted on printed circuit cards, and multi-layer ceramic modules (MLC), which are mounted on a printed circuit planar board, are combined into one hybrid package. An air cooling distribution system is provided wherein air is first caused to impinge against the multi-layer ceramic modules after which it is directed to flow serially across the metallized ceramic modules.

4 Claims, 1 Drawing Figure

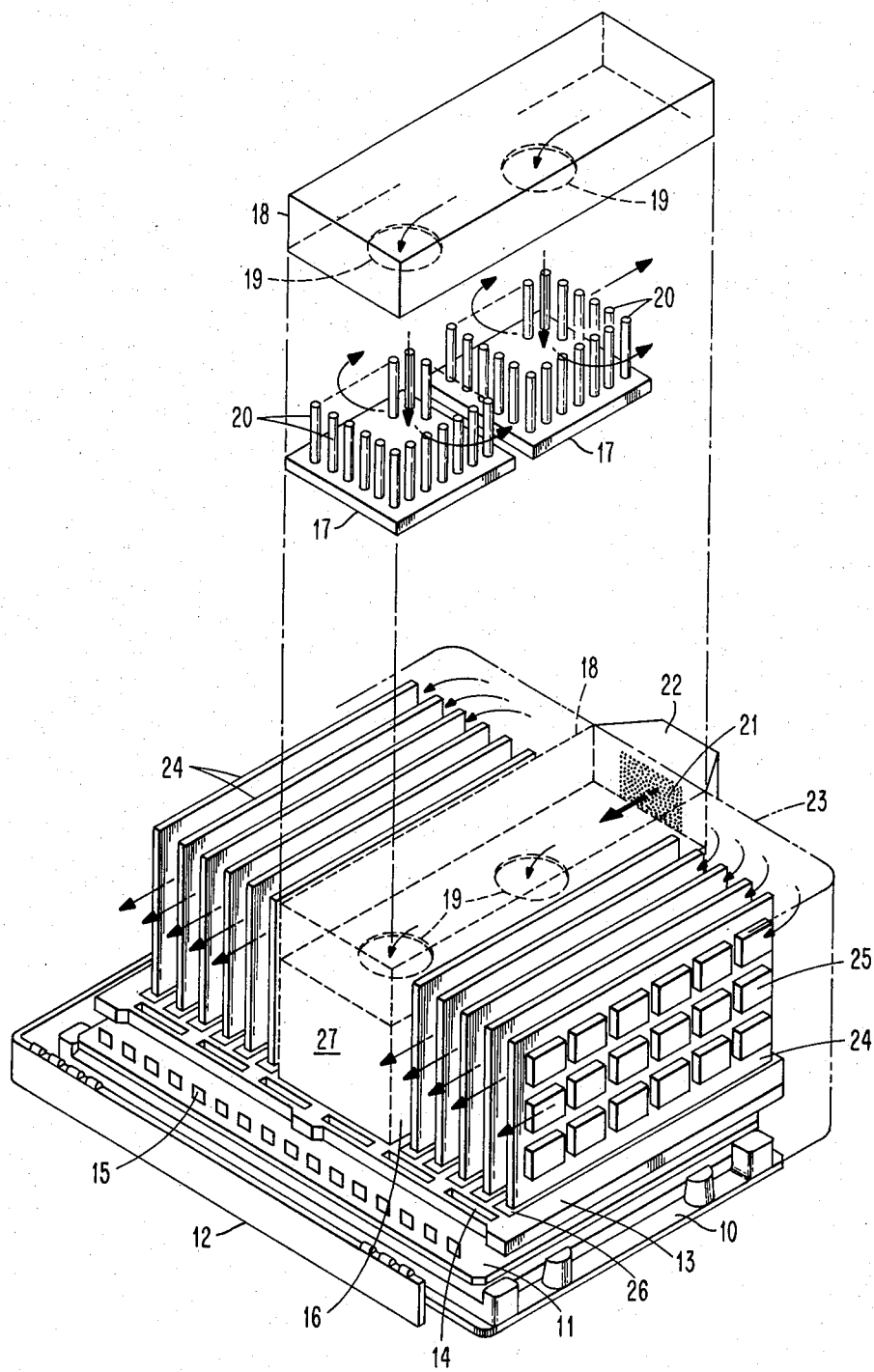

AIR-COOLED HYBRID ELECTRONIC PACKAGE

BACKGROUND OF THE INVENTION

The current demand for electronic computers having greater speed and higher performance criteria creates stringent price-to-performance objectives which requires the use of existing packaging technologies. Two packaging technologies available today are metallized ceramic modules (MC) and multi-layer ceramic modules (MLC). As is known in the industry, MC modules comprise a ceramic substrate base on which a layer of metallized circuitry, which may be termed as a signal plane, is personalized and integrated circuit chips are conductively bonded to this circuit plane. MC modules are mounted on printed circuit cards and, as a result, they are limited in the number of input-output (I-O) connections that can be made; they introduce relatively large time delays in signal propagation; however, they are considered to be relatively inexpensive.

MLC modules comprise a ceramic substrate base on which more than one layer of metallized circuitry or signal plane is personalized and may also include a power or ground plane. These planes are separated by a dielectric material and plated-thru holes are used to electrically connect the planes to internal wiring. Integrated circuit chips are conductively bonded to the top metallized plane of the module. MLC modules are mounted on planar printed circuit boards and are therefore not limited in the number of I-O connections that can be made. Because MLC modules have relatively many more chips on the same module, lead lengths between chips are short. Therefore, signal propagation time delays are short. However, MLC modules are considered to be relatively expensive.

The packaging strategy for meeting price-to-performance objectives is to put that portion of the computing system which most affects the machine cycle time; namely, the logic, into MLC modules. The portion of the computing system which has less effect on machine cycle tiem; such as, the main memory, may be packaged in MC modules. Since price-to-performance dictates the use of two different types of modules within the same package, it is desirable to provide a special hybrid package configuration which will satisfy both the electrical requirements of planar and card-on-board connections and the mechanical requirements; such as, cooling.

SUMMARY OF THE INVENTION

The present invention provides a novel and efficient hybrid package for housing and satisfying the electrical and mechanical requirements of the above described two different types of modules. A housing is provided wherein printed circuit cards on which MC modules are mounted are located to the left and right of a center section. The cards connect into a planar circuit board in the bottom of the housing. The center section is made up of a top air plenum located over an MLC chamber where the MLC modules are housed and connected to the planar circuit board. Air is drawn into the top air plenum by means of a fan attached to the back of that plenum. Holes in the bottom of the plenum and located directly over the cooling pin caps on each of the MLC modules permit the plenum-fan air to enter the MLC chamber and impingement cool the MLC modules. The front of the MLC chamber is closed and the air cooling the MLC modules flows to the back of the chamber which is open to a back plenum. The air flowing to the back plenum then turns around and flows over the circuit cards and MC modules. The air is exhausted at the front of the package.

The package employs highly effective MLC module impingement cooling with serial card-on-board MC module cooling. Impingement cooling is known to produce effective heat transfer at relatively low pressure drops. As a result, a small sized fan can be used for cooling. Also, the cost of cooling the hybrid package is reduced since practical use is made of the flow of air, after impingement of the MLC modules, to cool the MC modules which have less thermal dissipation than that of the MLC modules.

In addition, the package can readily be modified to incorporate either more circuit card with MC modules or more MLC modules without introducing any additional cooling needs beyond the selection of a fan.

Accordingly, a primary object of the present invention is to provide a novel air-cooled hybrid electronic package having two different types of modules.

Another object of the present invention is to provide a novel hybrid package for satisfying the electrical and cooling requirements of metallized ceramic modules and multi-layer ceramic modules.

A further object of the present invention is to provide a novel air-cooled hybrid package having metallized ceramic modules mounted on printed circuit cards and multi-layer ceramic modules mounted on a printed circuit board.

A still further object of the present invention is to provide a novel hybrid package having multi-layer ceramic modules and metallized ceramic modules and including air cooling means for directing air to impinge against the multi-layer ceramic modules and to flow serially across the metallized ceramic modules.

The foregoing and other objects, features and advantages of the invention will be apparent from the following more particular description of a preferred embodiment of the invention, as illustrated in the accompanying drawing.

BRIEF DESCRIPTION OF THE DRAWING

The single drawing is an exploded isometric view of the air-cooled hybrid electronic package of the present invention.

DESCRIPTION OF PREFERRED EMBODIMENT

Referring to the drawing, there is shown a support plate 10 to which is mounted a printed circuit board 11. The support plate is part of a suitable gate frame assembly of the type used with computers for supporting and housing circuit boards, cards, and electronic components. A power bus 12 provides power for the circuit board. The circuit board 11 has a board stiffener 13 attached thereto which has slots 14 for receiving input-output (I/O) connectors which plug into the board. A raceway 15 is provided to hold the cable wires of the I/O connectors which would connect to other circuit boards or electronic devices.

Mounted on the center section of the board stiffener 13 is a box-like chamber 16 for housing multi-layer ceramic modules (MLC) 17 which are electrically plugged into circuit board 11 through suitable openings in the board stiffener 13. Attached to chamber 16 is a top air plenum 18 having openings 19 which communicate with chamber 16 and which are located directly over the cooling studs or pins 20 on the caps of the MLC modules 17 housed in the chamber 16. The back of plenum 18 is connected to an air filter 21 which is connected to an air moving device 22, such as, a fan or blower. The back portion of chamber 16 is open and communicates with a back air plenum 23 which is attached to the gate frame assembly. Located to the left and right of chamber 16 are mounted printed circuit cards 24 each of which has connected thereto a plurality of metallized ceramic modules (MC) 25. The cards 24 have edge connectors which fit into slots 26 in the board stiffener and electrically plug into circuit board 11.

In the operation of the unique air-cooling distribution system of the hybrid package, air is forced into the top air plenum 18 by the air moving device 22 and the plenum air flows down through the openings 19 into the MLC chamber 16 to impinge against the cooling pins 20 on the MLC caps, as indicated by the arrows, and impingement cool the MLC modules 17. A panel 27 closes the front of the MLC chamber 16 and as a result the air cooling the MLC modules flows to the back of the chamber into the back air plenum and then turns around and flows serially over the circuit cards 24 and MC modules 25, as indicated by the arrows, to cool the MC modules. The air exhausts at the front of the package.

As an example of the cooling capability of the present hybrid package, assume that there are two large MLC modules 17 in chamber 16 each having $\frac{5}{8}$" diameter, 1" high staggered cooling pins 20 on their caps and 16 3" high, 4" wide circuit cards 24 with the MC modules 25 thereon. Also, assume the room temperature is approximately 32° C.

The maximum allowable junction temperature of the integrated circuit chips on the MC and MLC modules is preferably 85° C. and taking this in consideration, in the present example, the air moving device 22 is selected to deliver air at 30 cubic feet per minute per module position. The impingement cooling will result in MLC module heat dissipation of approximately 60 watts. The air circulation which serially cools the circuit cards will be 3.8 cubic feet per minute per cubic centimeter and circuit card heat dissipation will be approximately 14 watts.

It will be understood that the present hybrid package uniquely and effectively houses and cools two different types of circuit modules, and that its conceptional arrangement can readily be modified in size to incorporate more or less circuit cards and/or MLC modules without introducing any additional cooling needs beyond the selection of an air moving device.

A panel on the gate frame assembly would be either hinged or made removable to allow removal of chamber 16 and top air plenum 18 for insertion and removal of the MLC modules as well as the printed circuit cards.

While the invention has been particularly shown and described with reference to a preferred embodiment thereof, it will be understood by those skilled in the art that various changes in form and details may be made therein without departing from the and spirit scope of the invention.

What is claimed is:

1. A hybrid electronic package assembly which comprises:
   a chamber housing a plurality of first circuit modules mounted on a planar printed circuit board;
   a plurality of printed circuit cards arranged vertically on opposite sides of said chamber and having a plurality of second circuit modules mounted thereon;
   a top air plenum located over said chamber and having bottom openings located directly over each of said first circuit modules;
   means supplying a flow of air into said top plenum, said air flowing through said openings and impinging against the top of each of said first circuit modules; and
   a back air plenum connected to the back of said chamber directing the air flow out of said chamber, through said back plenum, and across said circuit cards and said second circuit modules.

2. A hybrid electronic package assembly as defined in claim 1 wherein said first circuit modules are multi-layer ceramic modules and said second circuit modules are metallized ceramic modules.

3. A hybrid electronic package assembly which comprises:
   a chamber housing a plurality of multi-layer ceramic modules mounted on a planar printed circuit board;
   a plurality of printed circuit cards arranged vertically on opposite sides of said chamber and having a plurality of metallized ceramic modules mounted thereon;
   a top air plenum connected to said chamber and having bottom openings communicating with said chamber and located directly over each of said multi-layer ceramic modules;
   an air moving unit connected to said top air plenum supplying a flow of air into said top plenum, said air flowing through said bottom openings and impinging against the top of each of said multi-layer ceramic modules; and
   a back air plenum connected to the back of said chamber directing the air flow out of said chamber, through said back plenum, and serially across said circuit cards an metallized ceramic modules.

4. A hybrid electronic package assembly as defined in claim 3 wherein a front panel on said chamber causes the impinged air on the multi-layer ceramic modules to turn around and flow into said back air plenum.

* * * * *